United States Patent [19]

Arakawa

[11] Patent Number: 5,389,805
[45] Date of Patent: Feb. 14, 1995

[54] SOLID-STATE IMAGE SENSING DEVICE
[75] Inventor: Kenichi Arakawa, Kanagawa, Japan
[73] Assignee: Kabushiki Kaisha Toshiba, Kanagawa, Japan
[21] Appl. No.: 219,836
[22] Filed: Mar. 29, 1994
[30] Foreign Application Priority Data
  Mar. 30, 1993 [JP] Japan .................................. 5-072270
[51] Int. Cl.⁶ .................... H01L 29/796; H01L 27/14; H01L 31/00
[52] U.S. Cl. ..................................... 257/222; 257/233
[58] Field of Search ................. 257/222, 223, 232–234

[56] References Cited

U.S. PATENT DOCUMENTS

| | | | |
|---|---|---|---|
| 4,514,766 | 4/1985 | Koike et al. | 257/233 |
| 5,132,762 | 7/1992 | Yamada | 257/222 |
| 5,181,093 | 1/1993 | Kawaura | 257/223 |
| 5,233,429 | 8/1993 | Jung | 257/223 |
| 5,276,341 | 1/1994 | Lee | 257/223 |
| 5,313,081 | 5/1994 | Yamada | 257/222 |

*Primary Examiner*—Gene M. Munson
*Attorney, Agent, or Firm*—Finnegan, Henderson, Farabow, Garrett & Dunner

[57] ABSTRACT

A solid-state image sensing device comprises: a charge storage layer (12) formed in the vicinity of a surface of a first conductive type semiconductor substrate (11), for transferring incident light into an electric signal photoelectrically and further storing the transferred electric signal as a signal charge temporarily; a transfer channel (14) formed on the surface of the semiconductor substrate, for transferring the signal charge stored in the charge storing layer; a depletion prevention layer (13) formed on the surface of the semiconductor substrate and on the charge storage layer, for preventing interfaces from being depleted; and a barrier layer (16) formed at a position deeper than the transfer channel, for preventing punch through from being generated between the charge storage layer (12) and the transfer channel (14). The barrier layer (16) is formed locally at such a position that a maximum impurity concentration thereof is located at a position deeper than the depletion prevention layer. In the image sensing device, when the junction length between the barrier layer and the depletion prevention layer is shortened for miniaturization, it is possible to prevent the impurity concentration of the transfer channel from being lowered by the barrier layer, so that a drop of the transfer capacity of the transfer channel can be prevented, thus reducing the size of and increasing the number of pixels.

6 Claims, 4 Drawing Sheets

SOLID-STATE IMAGE SENSING DEVICE

BACKGROUND OF THE INVENTION

The present invention relates to a solid-state image sensing device.

The structure of a solid-state image sensing device related to the present invention will be described hereinbelow with reference to FIG. 4, which is a longitudinal cross-sectional view thereof.

Near the surface of a p-type semiconductor substrate 1, an n-type impurity charge storage layer 2 is formed to transfer light allowed to be incident upon the charge storage layer 2 into a signal charge photoelectrically and further to accumulate the transferred signal charge temporarily.

Further, on the surface of the semiconductor substrate 1, an n-type impurity transfer channel 4 is formed in the vicinity of the charge storage layer 2. The signal charge stored in the charge storage layer 2 is given to the transfer channel 4 and further transferred in a direction perpendicular to the paper.

Further, on the surface of the semiconductor substrate 1 and on the charge storage layer 2, a p-type impurity depletion prevention layer 3 is formed for prevention of depletion at the interface of the charge storage layer 2. Extending to near the transfer channel 4, this depletion prevention layer 3 is provided with a function of isolating the transfer channel 4 from the charge storage layer 2, respectively.

A p-type impurity barrier layer 6 is located between the charge storage layer 2 and the transfer channel 4 for prevention of punch through between both from being generated.

A transfer electrode 5 is formed on the transfer channel 4 via an insulating film (not shown) to transfer the signal charge through the transfer channel 4 in response to a pulse signal.

When further microminiaturization in the size of each pixel and further increase in the number of pixels are required for the above-mentioned solid-state image sensing device, the following problem arises: In FIG. 4, a junction length L1 between the barrier layer 6 and the depletion prevention layer 3 must be sufficiently long. In general, this length L1 is about 1 μm. This is because when the junction length L1 is too short, punch through will be generated between the transfer channel 4 and the charge storage layer 2, with the result that the image quality is degraded.

On the other hand, when the impurity concentration of the barrier layer 5 is increased in order to shorten the junction length L1 without generating the punch through between both, there exists a limit. This is because since the barrier layer 6 is formed by thermally diffusing the impurities implanted near the interfaces in the semiconductor substrate 1, the impurities of the transfer channel 4 and of the barrier layer 6 cancel each other in an area 4a of the transfer channel 4 in contact with the barrier layer 6, so the n-type impurity concentration of the transfer channel 4 will be lowered. As a result, there exists a problem in that the transfer capacity of the transfer channel 4 is lowered.

SUMMARY OF THE INVENTION

Accordingly, it is the object of the present invention to provide a solid-state image sensing device whose size of pixel can be further microminiaturized and whose number of pixels can be further increased, without causing such problems that the sensed image quality is deteriorated and the transfer capacity is lowered.

To achieve the above-mentioned object, the present invention provides a solid-state image sensing device, comprising: a charge storage layer formed in the vicinity of a surface of a semiconductor substrate, for transferring light allowed to be incident thereupon into an electric signal photoelectrically and further storing the transferred electric signal as a signal charge temporarily; a transfer channel formed on the surface of the semiconductor substrate, for transferring the signal charge stored in said charge storing layer; a depletion prevention layer formed on the surface of the semiconductor substrate and on said charge storage layer, for preventing interfaces from being depleted; and a barrier layer formed at a position deeper than said transfer channel, for preventing punch through from being generated between said charge storage layer and said transfer channel, said barrier layer being located locally at such a position that a maximum impurity concentration thereof is located at a position deeper than said depletion prevention layer.

In the solid-state image sensing device according to the present invention, since the maximum impurity concentration position of the barrier layer is determined locally at a position deeper than the depletion prevention layer, it is possible to prevent the impurity concentration of the transfer channel (which distributes on the substrate surface) from being lowered by the barrier layer, so that a drop of the transfer capacity of the transfer channel can be prevented. Therefore, the junction length between the barrier layer and the depletion prevention layer can be shortened by hightening the impurity concentration of the barrier layer, and the size of the device can be decreased and the number of pixels can be further increased.

Furthermore, when the junction depth of the transfer channel is determined to be roughly equal to or shallower than the junction depth of the depletion prevention layer, it is possible to further increase the transfer capacity of the transfer channel and enhance the above mentioned effects.

DETAILED DESCRIPTION OF THE PREFERRED EMBODIMENTS

Figure 1:
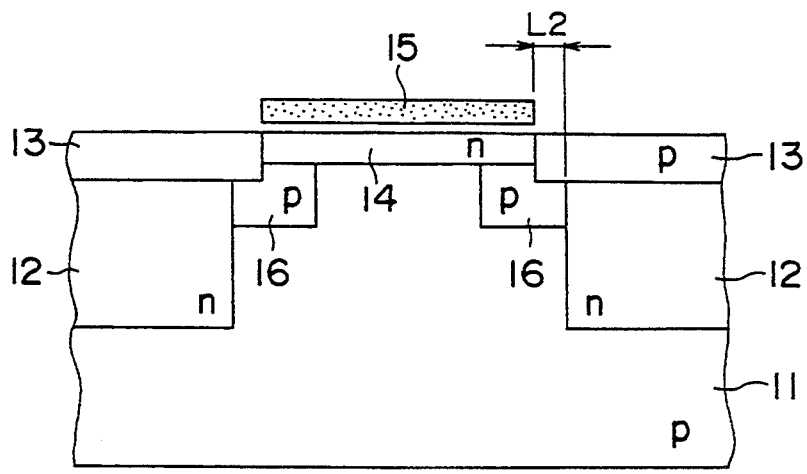
FIG. 1 is a longitudinal cross-sectional view showing an embodiment of the solid-state image sensing device according to the present invention.

An embodiment of the present invention will be described hereinbelow with reference to the attached drawings. FIG. 1 is a longitudinal cross-sectional view showing the same.

Near the surface of a p-type semiconductor substrate 11, an n-type impurity charge storage layer 12 is formed. The charge storage layer 12 transfers light allowed to be incident thereupon into a signal charge photoelectrically and further accumulates the transferred signal charge temporarily. Further, in the vicinity of the charge storage layer 12, an n-type impurity transfer channel 14 is formed. The signal charge stored in the charge storage layer 12 is given to the transfer channel 14 and further transferred in a direction perpendicular to the paper. On the charge storage layer 12, a p-type impurity depletion prevention layer 13 is formed for prevention of depletion at the interfaces in the semiconductor substrate and further for isolation between the transfer channel 14 and the charge storage layer 12. Further, a p-type impurity barrier layer 16 is provided between the charge storage layer 12 and the transfer channel 14 for prevention of punch through between both. Furthermore, a transfer electrode 15 is formed on the transfer channel 14 via an insulating film (not shown).

In comparison with the related image sensing device shown in FIG. 4, the features of the image sensing device of the present invention as described above with reference to FIG. 1 are as follows:

The maximum concentration position of the p-type impurities for constituting the barrier layer 16 is located deeper than the depletion prevention layer 13 at such a position that in the case that the barrier layer 16 is not formed, when punch through is generated, the potential of the channel of the isolation region is located at the maximum concentration position of the barrier layer 16 to enhance the effect of the isolation. Here, the maximum concentration position of the barrier 16 of the invention image sensing device shown in FIG. 1 is compared in further detail with that of the barrier 6 of the related image sensing device shown in FIG. 4.

Figure 2:
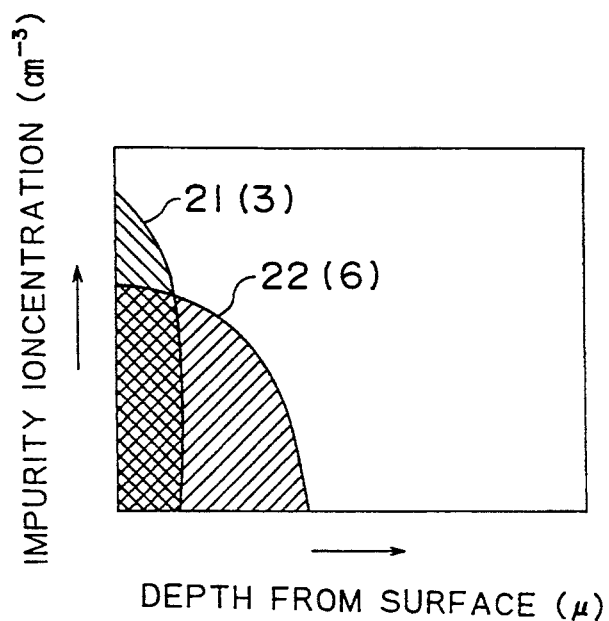
FIG. 2 is a graphical representation showing the impurity concentration distributions of the barrier layer 22 and the depletion prevention layer 21 of the image sensing device related to the present invention in the depth direction of the semiconductor substrate thereof.
Figure 4:
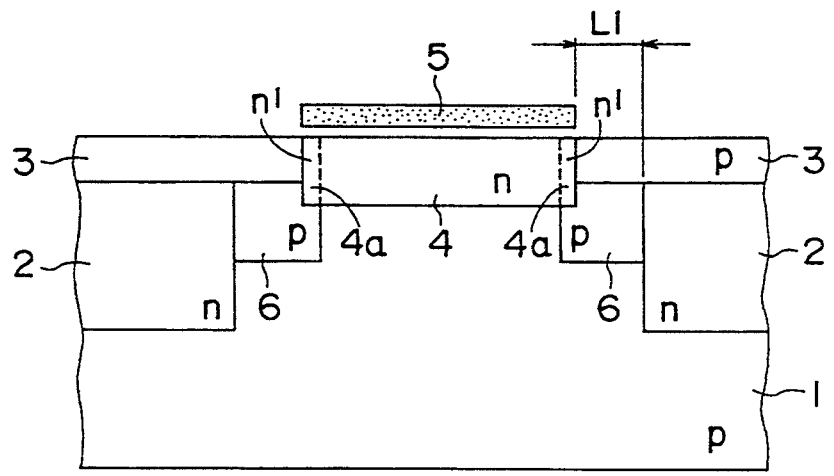
FIG. 4 is a longitudinal cross-sectional view showing solid-state image sensing device related to the present invention.

FIG. 2 shows a region 22 of the p-type impurity concentration distribution of the barrier layer 6 and a region 21 of the p-type impurity concentration distribution of the depletion prevention layer 3 of the related device shown in FIG. 4. As shown by the region 22 in FIG. 2, in the related device shown in FIG. 4, the impurity concentration of the barrier 6 is maximum in the vicinity of the substrate surface and gradually decreases in the depth direction away from the substrate surface. This is because the p-type impurities are first implanted near the substrate surface at a relatively low acceleration voltage, and thereafter the impurities are diffused deep so as to form the barrier layer 6 by the thermal diffusion process.

As described above, in the related image sensing device as shown in FIG. 4, since the impurity concentration of the barrier layer 6 is maximum in the vicinity of the substrate surface, when the junction length L1 between the barrier layer 6 and the depletion prevention layer 3 is shortened, the n-type impurity concentration at a part (in contact with the barrier layer 6) of the region 4a of the transfer channel 4 is lowered, with the result that the transfer capacity of the transfer channel 4 is degraded as already explained.

Figure 3:
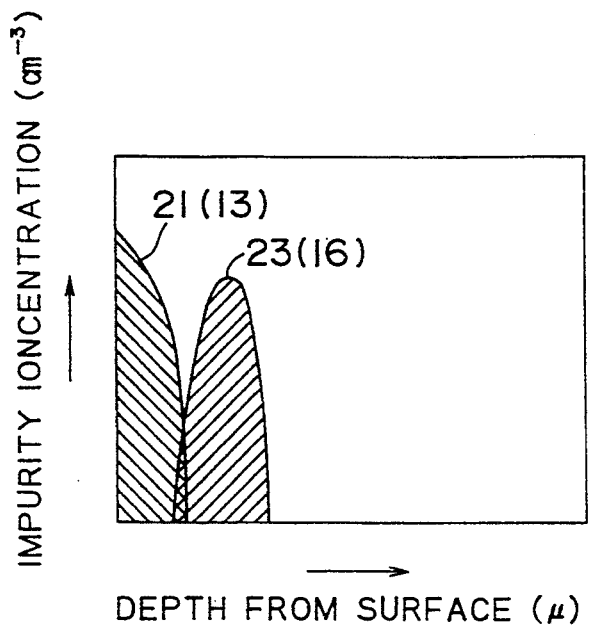
FIG. 3 is a graphical representation showing the impurity concentration distributions of the barrier layer 23 and the depletion prevention layer 21 of an embodiment of the image sensing device according to the present invention in the depth direction of the semiconductor substrate thereof.

In contrast with this, the barrier layer 16 of the image sensing device of the present invention is formed as shown in FIG. 3. FIG. 3 shows a region 23 of the p-type impurity concentration distribution of the barrier layer 16 and a region 21 of the p-type impurity concentration distribution of the depletion prevention layer 13 of the invention device shown in FIG. 1. As shown by the region 23 in FIG. 3, in the invention device shown in FIG. 1, the impurity concentration of the barrier layer 16 distributes locally in such a way that the maximum concentration thereof is located at a deep depth from the substrate surface without any distribution on and near the substrate surface. Accordingly, even when the junction length L2 is shortened, the n-type impurities of the transfer channel 4 distributing on the substrate surface are not canceled by the p-type impurities of the barrier layer 16, with the result that the transfer capacity of the transfer channel 14 is prevented from being lowered by the barrier layer 16.

Furthermore, the diffusion length of the n-type impurities for constituting the transfer channel 14 in the depth direction thereof is determined to be roughly equal to or shorter than the diffusion length of the depletion prevention layer 13. As the n-type impurities, a relatively heavy element of 5 group (e.g., arsenic) is used for prevention of the transfer channel 14 from being diffused deeper than required.

The above-mentioned barrier layer 16 in which the impurities are located locally at a deep position away from the semiconductor substrate 1 can be realized by determining the acceleration voltage to be as high as 400 KeV, for instance and almost never performing the thermal diffusion. In addition, when the concentration of the barrier layer 16 is determined as high as $1 \times 10^{12}$ to $1 \times 10^{13}$ cm$^{-2}$ in dose, it is possible to prevent the punch through between the transfer channel 14 and the charge storage layer 12 more effectively.

As described above, in the image sensing device of the present invention, since the junction length between the transfer channel 14 and the depletion prevention layer 13 in the depth direction is shorter than the depth of the depletion prevention layer 13 and in addition since the barrier layer 16 is located locally at a position deeper than the transfer channel 14, even when the junction length L2 between the depletion prevention layer 13 and the barrier layer 16 is determined short and further the impurity concentration of the barrier layer 16 is increased for prevention of the punch through between the transfer channel 14 and the charge storage layer 12, it is possible to prevent impurity concentration of the transfer channel 14 from being lowered, so that it is possible to prevent the transfer capacity of the transfer channel 14 from being degraded. Further, since the junction depth of the transfer channel 14 of the sensing device of the present invention is determined to be shallower than that of the related sensing device, it is possible to set the distance between the charge storage layer 12 and the transfer channel 14 equal to or larger than L2 and prevent the punch through effectively. Furthermore, the transfer capacity of the transfer channel 14 can be increased. Thus, the distance L2 between the two adjacent elements can be reduced, and the region for the charge storage layer 12 can be further widened to that extent, so that the opening portion of the image sensing device can be further widened for improvement of the sensitivity.

As described above, in the image sensing device according to the present invention, it is possible to miniaturize the shape of the device and therefore to increase the number of pixels, without causing any image quality deterioration due to punch through and any reduction of the transfer channel capacity.

Figure 5:
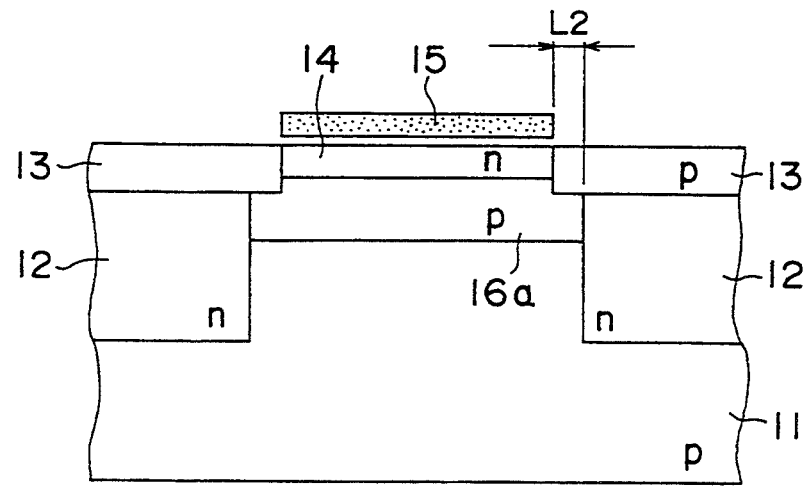
FIGS. 5 to 7 are longitudinal cross-sectional views showing other embodiments of the solid-state image sensing device according to the present invention.

The image sensing device has been described only by way of example. Accordingly, the present invention is not limited to only the embodiment as described above. For instance, in the device shown in FIG. 1, the barrier layer 16 is formed on both sides of the transfer channel 14. However, in another embodiment as shown in FIG. 5, a barrier layer 16a can be formed together so as to enclose the lower portion of the transfer channel 14. Furthermore, when a p-type semiconductor layer is formed on a n-type semiconductor substrate and back bias voltage is applied to the semiconductor substrate, the swear can be prevented more securely. In this embodiment shown in FIG. 5, it is possible to prevent the generation of swearing more securely. In more detail, even if the light allowed to be incident upon the device obliquely enters the inside (near the barrier layer 16a) of the semiconductor substrate 1 without entering the charge storage layer 12 and further transferred into a signal charge, it is possible to prevent the signal charge from being acquired by the transfer channel 14 owing to the presence of the barrier layer 16a.

Figure 6:
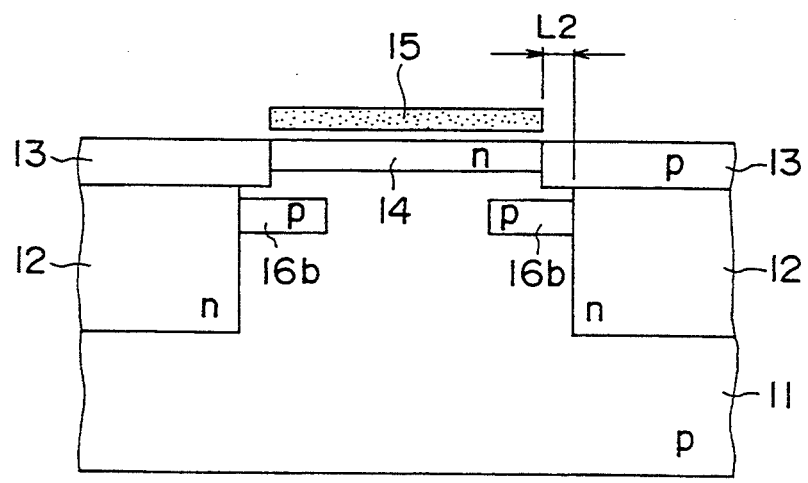

Further, in FIGS. 1 and 5, the barrier layer 16 or 16a is in contact with the depletion prevention layer 13. Without being limited thereto, however, as shown by another embodiment shown in FIG. 6, even if a gap exists to some extent between the barrier layer 16b and the depletion prevention layer 13, as far the gap potential is lower than the saturation potential of the charge storage layer 12 or the transfer channel 14, since the barrier is high, it is possible to prevent the defect of isolation from being generated between the charge storage layer 12 and the transfer channel 14.

Figure 7:
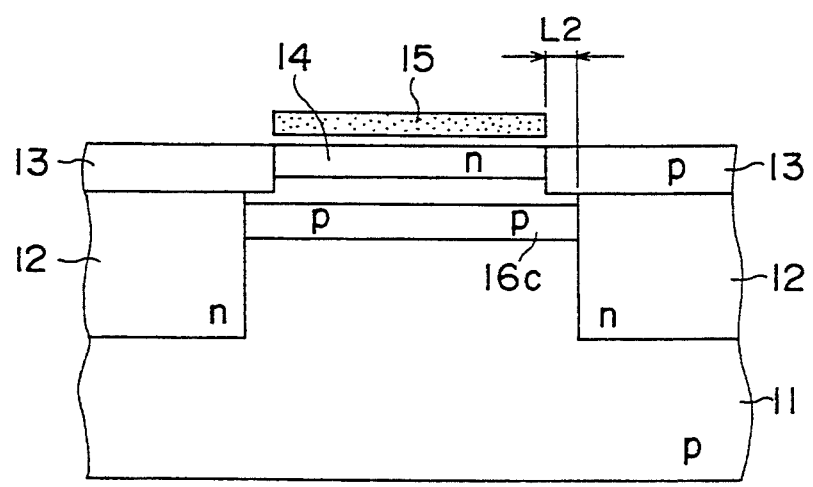

Further, in another embodiment as shown in FIG. 7, it also possible to form a gap between the barrier layer 16c and the depletion prevention layer 13 in the depth direction in such a way that the barrier 16c encloses the lower portion of the transfer channel 14.

What is claimed is:

1. A solid-state image sensing device, comprising:
   a charge storage layer formed in the vicinity of a surface of a semiconductor substrate, for transferring light allowed to be incident thereupon into an electric signal photoelectrically and further storing the transferred electric signal as a signal charge temporarily;
   a transfer channel formed on the surface of the semiconductor substrate, for transferring the signal charge stored in said charge storing layer;
   a depletion prevention layer formed on the surface of the semiconductor substrate and on said charge storage layer, for preventing an interface of said charge storage layer from being depleted; and
   a barrier layer formed at a position deeper than said transfer channel, for preventing punch through from being generated between said charge storage layer and said transfer channel, said barrier layer being located locally at such a position that a maximum impurity concentration of said barrier layer is located at a position deeper than said depletion prevention layer.

2. The solid-state image sensing device of claim 1, wherein a junction depth of said transfer channel is roughly equal to or shallower than a junction depth of said depletion prevention layer.

3. A solid-state image sensing device, comprising:
   first and second charge storage layers formed in the vicinity of a surface of a semiconductor substrate so as to be opposed each other, for transferring light allowed to be incident thereupon into electric signals photoelectrically and further storing the transferred electric signals as signal charges temporarily, respectively;
   a transfer channel formed on the surface of the semiconductor substrate and in a region enclosed by said first and second charge storage layers, for transferring the signal charges stored in said first and second charge storing layers, respectively;
   first and second depletion prevention layers formed on the surface of the semiconductor substrate and on said first and second charge storage layers respectively, for preventing each interface of said first and second charge storage layers from being depleted; and
   a first barrier layer formed at a position deeper than said transfer channel, for preventing punch through from being generated between said first charge storage layer and said transfer channel; and a second first-conductive type barrier layer formed at a position deeper than said transfer channel, for preventing punch through from being generated between said second charge storage layer and said transfer channel, said first and second barrier layers being located locally at such positions that maximum impurity concentrations of said first and second barrier layers are located at positions deeper than said first and second depletion prevention layers, respectively.

4. The solid-state image sensing device of claim 3, wherein a junction depth of said transfer channel is roughly equal to or shallower than junction depths of said first and second depletion prevention layers, respectively.

5. The solid-state image sensing device of claim 3, wherein an end of said first barrier layer and an end of said second barrier layer are connected to each other and formed integral so as to enclose a lower portion of said transfer channel.

6. The solid-state image sensing device of claim 4, wherein an end of said first barrier layer and an end of said second barrier layer are connected to each other and formed integral so as to enclose a lower portion of said transfer channel.

* * * * *